United States Patent
Ståhl et al.

(10) Patent No.: US 6,305,406 B1
(45) Date of Patent: *Oct. 23, 2001

(54) SPRAY HOOD PROTECTOR IN A FLUID-BASED COOLING SYSTEM

(75) Inventors: Lennart Ståhl, Plano, TX (US); John Francis Wallace, Jr., San Ramon, CA (US); John Cardenas Parraz, San Ramon, CA (US); Montford Henry Clark, Basking Ridge, NJ (US); David Winn, Lafayette, CA (US)

(73) Assignees: Emerson Electric Co., St. Louis, MO (US); AT&T, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/089,333

(22) Filed: Jun. 2, 1998

(51) Int. Cl.$^7$ ............................. F28F 27/00; G05D 7/06; G01M 3/16
(52) U.S. Cl. ........................ 137/312; 73/40.5 R; 73/46; 137/392; 165/70; 222/108
(58) Field of Search .................... 137/312, 392; 73/40, 40.5 R, 46, 49.2, 49.3; 165/70, 104.31, 104.33, 11.1; 257/714; 361/699; 141/86; 220/578; 222/108

(56) References Cited

U.S. PATENT DOCUMENTS

| | | | |
|---|---|---|---|
| 4,138,856 | * | 2/1979 | Orlowski .............................. 165/70 |
| 4,313,457 | * | 2/1982 | Cliff ..................................... 137/312 |
| 4,450,855 | * | 5/1984 | Hills ..................................... 137/312 |
| 4,698,728 | | 10/1987 | Tustaniwsky et al. .............. 361/699 |
| 4,809,734 | * | 3/1989 | Cliff ..................................... 137/312 |
| 5,086,829 | * | 2/1992 | Asakawa ................................ 165/70 |
| 5,226,471 | | 7/1993 | Stefani ................................... 165/13 |
| 5,323,847 | * | 6/1994 | Koizumi et al. ................. 165/104.33 |
| 5,337,291 | | 8/1994 | Onodera et al. .................... 361/699 |
| 5,341,857 | * | 8/1994 | Bravo .................................. 137/312 |
| 5,511,573 | * | 4/1996 | Corte ................................... 137/312 |
| 5,555,907 | * | 9/1996 | Philipp ................................ 137/312 |
| 5,588,461 | * | 12/1996 | Plecnik ................................ 137/312 |
| 5,871,042 | | 2/1999 | Gutfeldt et al. ....................... 165/70 |
| 5,975,114 | * | 11/1999 | Stahl et al. .......................... 137/312 |
| 6,003,540 | * | 12/1999 | Bruni et al. ......................... 137/312 |

FOREIGN PATENT DOCUMENTS

| | | |
|---|---|---|
| 0421743A2 | 4/1991 | (EP) . |
| 0466102A1 | 1/1992 | (EP) . |
| 0803986A1 | 10/1997 | (EP) . |

OTHER PUBLICATIONS

Stahl and Zirath, *TELECOOL, a New Generation of Cooling Systems for Switching Equipment*, Ericsson Review, vol. 4, 1992, pp. 124–132.

* cited by examiner

*Primary Examiner*—George L. Walton
(74) *Attorney, Agent, or Firm*—Jenkens & Gilchrist PC

(57) ABSTRACT

A spray hood device for containing a fluid spray leak in a fluid-based cooling system. A cover member surrounds a given component subject to a fluid spray leak, containing fluid sprays, preventing the fluid sprays from reaching equipment therebelow and minimizing fluid leakage damage.

16 Claims, 4 Drawing Sheets

SPRAY HOOD PROTECTOR IN A FLUID-BASED COOLING SYSTEM

CROSS REFERENCE TO RELATED APPLICATION

This application is related to U.S. applications for patent, Ser. No. 09/088,755, filed Jun. 2, 1998, entitled "System, Method and Apparatus for Purging Fluid" now U.S. Pat. No. 5,975,114; Ser. No. 09/088,958, filed Jun. 2, 1998, entitled "Cooling System And Method for Distributing Cooled Air", now U.S. Pat. No. 6,161,612; and Ser. No. 09/088,981, filed Jun. 2, 1998, entitled "Cooling System and Method for Separating Air Flows in a Cooling System", now U.S. Pat. No. 6,034,873.

BACKGROUND OF THE INVENTION

1. Technical Field of the Invention

The present invention relates to cooling systems for cooling electronic equipment, and particularly to a spray protection and detection device for use in a fluid-based cooling system.

2. Background and Objects of the Invention

The growth of the computer industry and telephony over the past few decades has been phenomenal. The integration of these technologies, for example, in telecommunications switching systems, has lead to greater and greater efficiencies as larger numbers of communications are handled by fewer components, which are typically housed in a central control room.

One problem inherent with all electronic equipment, telecommunications or otherwise, is temperature control. As is readily apparent, if telecommunications switching equipment or other electronic components are not effectively cooled, the internal temperature of the electronic components substantially increase, thereby leading to significantly reduced system performance and, in some cases, total system failure.

Conventional approaches to cooling the aforementioned central control or other such apparatus/equipment include fluid based cooling systems in which air is directed in the proximity of heat exchanger units or cooling coils having cooled liquid flowing therethrough. The air is cooled as it passes the cooled coils. By directing the resulting cooled air towards the equipment to be cooled, the internal temperature of the equipment is reduced, thereby allowing the equipment to operate more efficiently and with reduced risk of system failure.

The above mentioned conventional cooling systems employ piping elements to route the cooling fluid between the system components, such as between the pump unit and the cooling coils. One common problem with these cooling systems is that occasionally a break occurs in the interlinkage or seal between the piping elements, in the seal between the piping elements and the system components, and in the piping elements themselves. A break may cause the cooling fluid to drip or to spray outwardly from the system at the point of the break.

Because portions of conventional cooling systems, such as the cooling coils and the piping elements connected thereto, are located in close proximity to electronic equipment which the cooling systems are adapted to cool, a break in the cooling system may result in cooling fluid leaking onto the equipment. Especially in the case where portions of the cooling system are suspended above the equipment, a spray leak or a drip leak of any magnitude may seriously damage the equipment and pose a threat of electrocution to a nearby operator. Needless to say, the potential harm resulting from a fluid leak in a fluid based cooling system is quite sizeable and reaches far beyond concerns for the cooling system itself.

One approach utilized in the prior art to overcome the problem of leakage from overhead cooling systems is double containment of components such as hydraulic and piping connections, i.e., sealing the suspect connection within an outer pipe. Double encasing, however, is complicated and expensive to implement. Further, leaks are not detected in such systems.

It is, therefore, an object of the present invention to provide a feature for a fluid based cooling system which minimizes fluid leakage from an overhead cooling system upon equipment therebelow.

It is another object of the present invention to provide a fluid leakage feature which is simple in construction, inexpensive to manufacture and easily retrofitted into existing fluid based cooling systems.

SUMMARY OF THE INVENTION

The present invention overcomes the shortcomings of prior cooling systems and satisfies a significant need for a cooling system which substantially eliminates the potential for damage due to fluid leakage therefrom. The present invention contains and controls cooling fluid sprays onto equipment therebelow.

A spray hood device for containing a fluid spray leak in a fluid-based cooling system. A cover member surrounds a given component subject to a fluid spray leak, containing horizontal and vertical fluid sprays, preventing the fluid sprays from reaching equipment therebelow and minimizing fluid leakage damage.

BRIEF DESCRIPTION OF THE DRAWINGS

A more complete understanding of the system and method of the present invention may be had by reference to the following detailed description when taken in conjunction with the accompanying drawings wherein.

DETAILED DESCRIPTION OF THE PREFERRED EMBODIMENTS

The present invention will now be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art.

Figure 1:
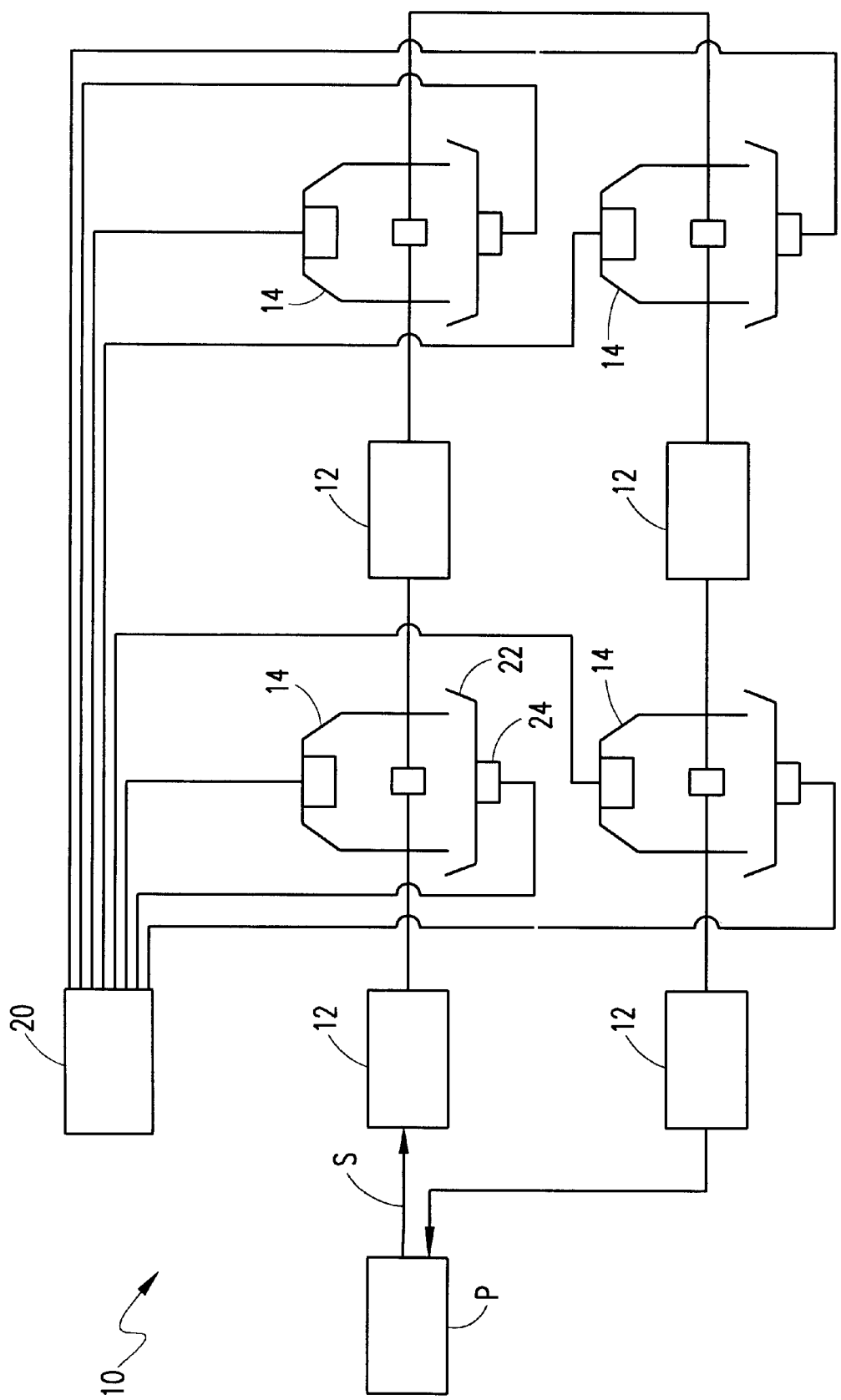
FIG. 1 is a diagram illustrating a preferred embodiment of a system employing the principles of the present invention.

Referring now to FIG. 1 there is illustrated an exemplary fluid-based cooling system 10 which advantageously employs the spray hood protection aspects of the present invention. The cooling system configuration shown in the figure also employs purge capability so that upon the detection of a spray or other leak condition, the fluid therein may be expeditiously expelled to avoid water or other fluid damage to sensitive electronic equipment in the area. Applicants' co-pending patent application, entitled "System, Method and Apparatus For Purging Fluid", filed concurrently herewith, describes a preferred implementation of the present invention in conjunction with the purging system described therein. Applicants' additional co-pending patent application disclosures, entitled "System and Method For Separating Airflows" and "System and Method For Distributing Airflows", also filed concurrently herewith, describe additional preferred features used in conjunction with the present invention. The disclosures of each of the above applications are accordingly incorporated herein by reference.

A cooling pump P pumps cooled fluid into a supply line S and reserves the fluid via a return line R. As shown in the figure, the fluid is pumped through a number of cooling coils 12 that include conventional heat exchange devices therein to cool the ambient air heated by heat generating devices, e.g., the aforementioned electronic equipment.

In a first embodiment of the present invention, a number of spray hoods 14 may be employed to cover various portions of the cooling system 10 likely to leak. For example, fluid leaks and sprays are most common along fittings and joiners, e.g., pipe interconnections to each other, valves or other components. When such weak links in the system are suspended over sensitive electronic components, the spray hoods 14 of the present invention are useful for containing any fluid sprays along there likely problem areas. The spray hood 14 is shown in more detail in FIG. 2.

Figure 2:
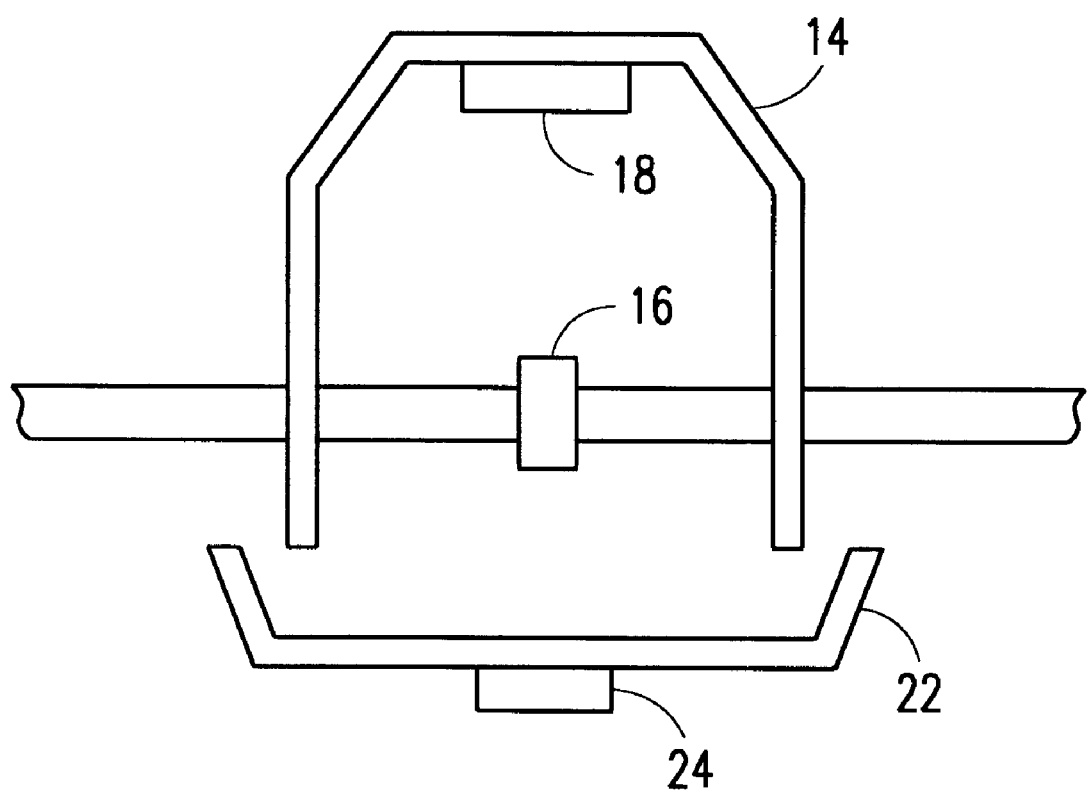
FIG. 2 is a sectional view of a spray hood component in accordance with a first embodiment of the present invention.

With reference new to FIG. 2, the spray hood 14 is situated around an interconnecting linkage 16 or other such likely leakage area. The spray hood 14 may be made of a rigid material, such as metal or plastic, or of a more flexible material, such as cloth, mesh, construction paper or other material capable of interrupting and deflecting a spray or stream of fluid, such as emanating from a compromised cooling system 10 component.

As shown in FIGS. 1 and 2, the spray hood 14 may contain a spray sensor 18 therein, secured to an inner surface of the spray hood 14 in close proximity to the potential leak. The spray sensor 18 preferable detects impact pressure, such as by spraying fluid, instead of detecting water itself. As shown in FIG. 1, upon detection of such an impact, the spray sensor 18 may transmit an electrical signal to a control unit 20 for processing, as described in more detail in Applicants' co-pending patent application entitled "System, Method and Apparatus For Purging Fluid", referred to hereinafter as the Purging Application. It should, of course, be understood that a number of such sensors 18 may be employed to improve the detection of fluid sprays.

As shown in FIGS. 1 and 2, the spray hood 14 in the first embodiment of the present invention also employs a drip pan 22 disposed beneath said spray hood 14 and said interconnecting linkage 16. It should be understood that the respective drip pans 22 are preferably sized to receive an appreciable amount of fluid that may leak from the linkage component 16. As with the spray hood 14, the drip pan 22 preferably has a drip sensor 24 associated therewith to detect the accumulation of fluid and transmit an electrical signal to that effect to the central unit 20 for processing.

The operational functions and parameters that may be utilized to detect the occurrence of a fluid leak in the cooling system 10 are described in more detail in Applicants' Purging Application which is incorporated by reference herein.

Figure 3:
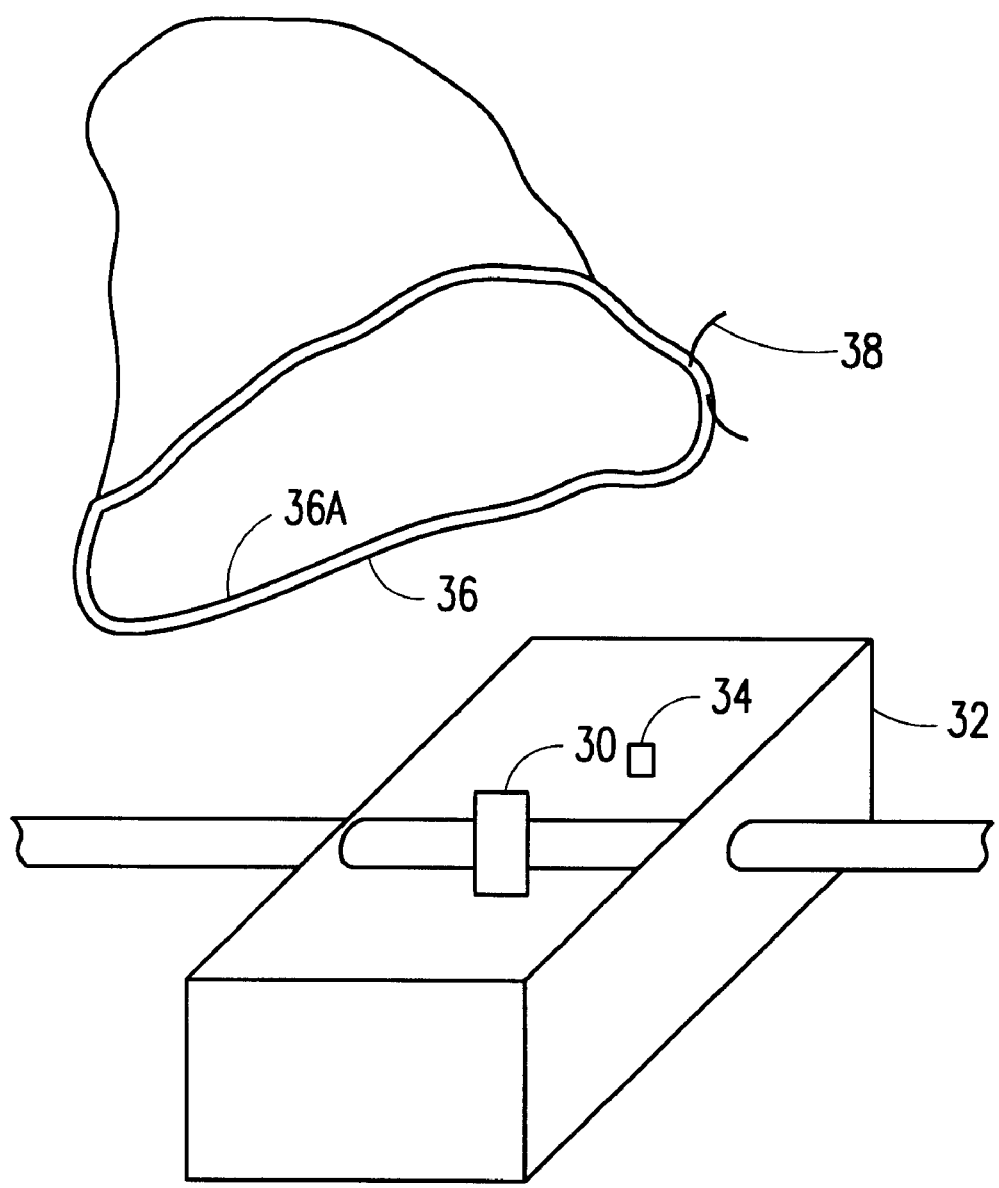
FIG. 3 is a perspective view of another configuration of the spray hood component in accordance with a second embodiment of the present invention.

Shown in FIG. 3 is another embodiment of the spray hood of the present invention. In particular, a given interconnecting linkage 30 may be partially enclosed by a box 32 or other housing, the bottom of the box 32 may constitute a drip pan as in the previous embodiment. A drip sensor 34 may be employed to detect accumulated fluid. To cover the box 32, a flexible member 36 may be used to drape over the open box 32, preventing fluid sprays from the linkage component 30 from reaching any sensitive electronics nearby. A drawstring 38 or elastic member may be employed along the edge 36A of the flexible member 36 to permit a substantial sealing off of the linkage component 30 and any leaks therefrom.

It should be understood that the box 32 may instead be covered by a conventional lid to contain the fluid sprays.

Figure 4:
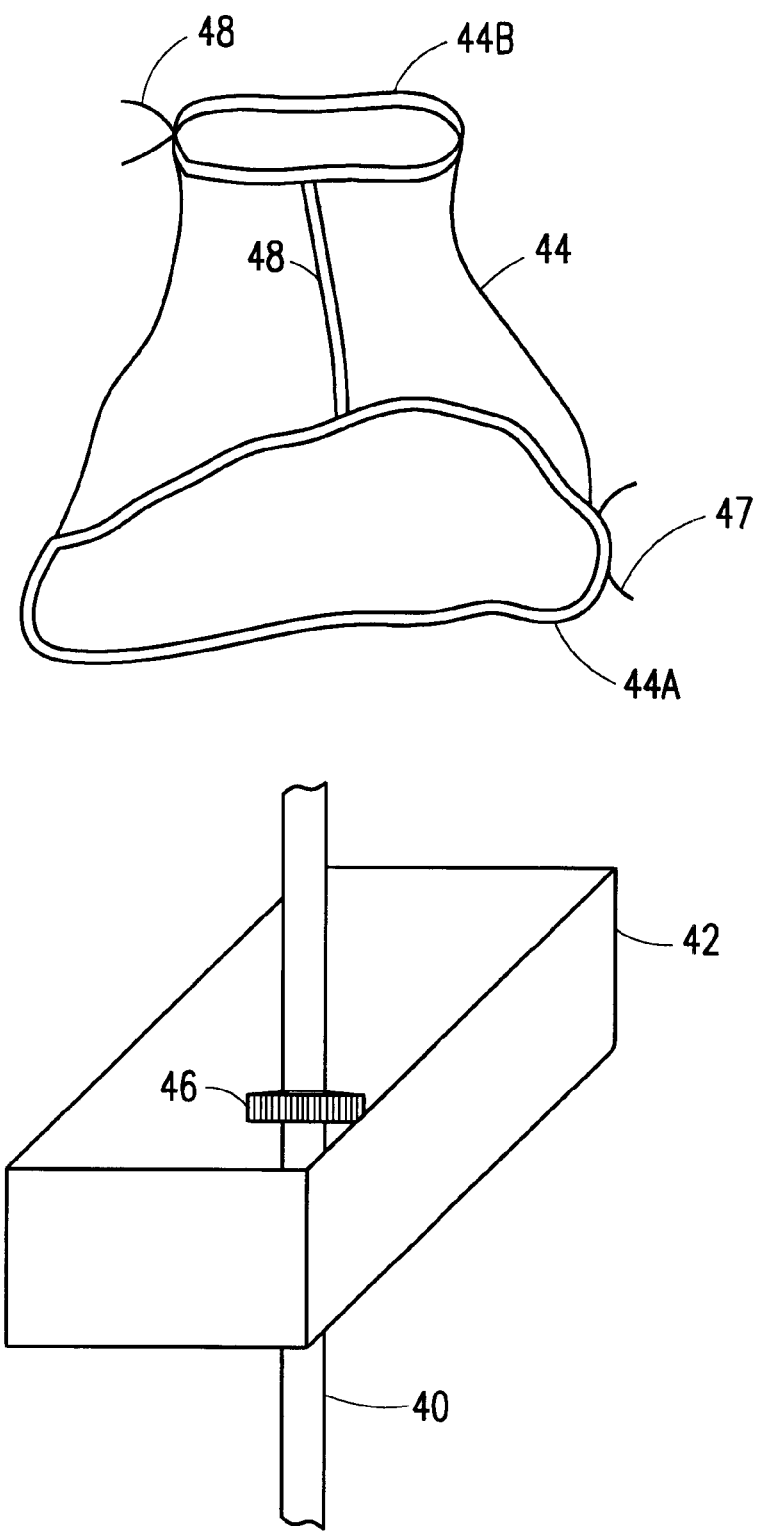
FIG. 4 is a perspective view of another embodiment of the present invention.

With reference now to FIG. 4, there is illustrated a further embodiment of the present invention which may be utilized in covering or otherwise surrounding pipe or other interconnections subject to leakage that are disposed at an angle or substantially vertically. In particular, a pipe 40 extends substantially vertically and a box member 42, as with the box member 32 in FIG. 3, partially encloses the pipe 40 horizontally and downwardly. It should be understood that the juncture of the pipe 40 with the bottom of the box 42 is preferably sealed with some conventional sealant to prevent leakage of sprayed or condensated fluids accumulating within the box member 42.

Another flexible member 44 may be used to drape over the top of the exposed box 42 to prevent any fluid sprays from a linkage component 46 in the pipe 40 from reaching any equipment nearby. As with the embodiment described in connection with FIG. 3, a drawstring 47 or elastic member may be employed along an edge 44A of the flexible member 44 to permit a substantial sealing off of the linkage component 46 and any leaks therefrom. Drip sensors (such as described in connection with FIG. 3) may be employed to detect any accumulated fluids. Another drawstring 48 or elastic member may be employed along another edge 44B to tighten the flexible member 44 around the pipe 40 in order to effectively seal off any vertically-disposed fluid sprays.

It should be understood that the flexible members 36 and 44 may be made of also any flexible material, such as cloth or other fabric, mesh, construction paper or other flexible wood-based products or any other material capable of interrupting and deflecting a spray or stream of fluid, such as emanating from a compromised system component. Further, the flexible members 36 and 44 may be substantially planar when extended and closeup around the box members through use of a zipper 48 or other such means, e.g., Velcro, buttons or other attachment means, to secure two ends of the respective flexible member together.

Although the preferred embodiments of the system and method of the present invention have been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. In an overhead fluid-based cooling system, a spray hood for preventing leaking of fluid sprays from at least one of a plurality of components at least one location along said fluid-based cooling system, said spray hood comprising:

a cover member, said cover member surrounding a given component of said at least one of a plurality of components of said cooling system substantially horizontally and vertically, whereby a substantially horizontally or vertically directed fluid spray from said given component is contained by said cover member, wherein said cover member protects other components of said fluid-based cooling system from being damaged by said fluid spray.

2. The spray hood according to claim 1, further comprising:

a spray detector disposed within said cover member, whereby said spray detector detects said fluid spray from said given component.

3. The spray hood according to claim 1, further comprising:

a drip pan disposed beneath said cover member, whereby a downwardly directed fluid spray from said given component is contained by said drip pan.

4. The spray hood according to claim 3, further comprising:

a drip detector attached to said drip pan, whereby said drip detector detects said fluid spray from said given component.

5. The spray hood according to claim 1, wherein said cover member is made of a substantially resilient material to contain said fluid spray.

6. The spray hood according to claim 5, wherein said substantially resilient material is selected from the group consisting of metal, plastic, fabric, wood products and glass.

7. In an overhead fluid-based cooling system, a spray hood device for preventing leaking of fluid sprays from at least one of a plurality of components at least one location along said fluid-based cooling system, said spray hood comprising:

a box member, said box member surrounding a given component of said at least one of a plurality of components of said cooling system substantially horizontally and downwardly, whereby a substantially horizontally or downwardly directed fluid spray from said given component is contained by said box member; and a top member, said top member being attached to said box member and surrounding said given component of said at least one of a plurality of components substantially vertically, whereby a substantially vertically-directed fluid spray from said given component is contained by said top member, wherein said box member and said top member protect other components of said fluid-based system from being damaged by said fluid spray.

8. The spray hood device according to claim 7, wherein said box member is made of a substantially resilient material to contain said fluid spray.

9. The spray hood device according to claim 7, wherein said top member is made of a substantially flexible material to contain said fluid spray.

10. The spray hood device according to claim 9, wherein said substantially flexible material is selected from the group consisting of fabric and wood products.

11. The spray hood device according to claim 7, wherein said top member further comprises a drawstring member therein for drawing said top member onto said box member, whereby said fluid spray is contained.

12. The spray hood device according to claim 11, wherein said top member further comprises a plurality of drawstring members to secure said top member onto said box member and another component, whereby said fluid spray is contained.

13. The spray hood device according to claim 7, wherein said top member further comprises an elastic member therein for tightening said top member onto said box member, whereby said fluid spray is contained.

14. The spray hood device according to claim 13, wherein said top member further comprises a plurality of elastic members to secure said top member onto said box member and another component, whereby said fluid spray is contained.

15. The spray hood device according to claim 7, further comprising an attachment means to secure one end of said top member to another end of said top member.

16. The spray hood device according to claim 15, wherein said attachment means is selected from the group consisting of a zipper, Velcro and buttons.

* * * * *

UNITED STATES PATENT AND TRADEMARK OFFICE
CERTIFICATE OF CORRECTION

PATENT NO. : 6,305,406 B1
DATED : October 23, 2001
INVENTOR(S) : Lennart Stahl et al.

It is certified that error appears in the above-identified patent and that said Letters Patent is hereby corrected as shown below:

Column 4,
Line 66, replace "components at least one" with -- components at at least one --

Column 5,
Line 33, replace "components at least one" with -- components at at least one --

Signed and Sealed this

Eighteenth Day of February, 2003

JAMES E. ROGAN
*Director of the United States Patent and Trademark Office*